(12) United States Patent
Matui

(10) Patent No.: US 7,988,312 B2
(45) Date of Patent: Aug. 2, 2011

(54) LIGHT SOURCE APPARATUS WITH REFLECTOR GAS-BLASTING STRUCTURE

(75) Inventor: Ryotaro Matui, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 11/902,127

(22) Filed: Sep. 19, 2007

(65) Prior Publication Data

US 2008/0180644 A1    Jul. 31, 2008

(30) Foreign Application Priority Data

Jan. 26, 2007  (JP) ............................. P2007-016676

(51) Int. Cl.
*F21V 33/00*    (2006.01)
*F21V 29/02*    (2006.01)
(52) U.S. Cl. ..................... 362/96; 362/294; 362/373
(58) Field of Classification Search .............. 362/562, 362/580, 96, 294, 296.01, 310, 311.11, 373; 250/492.1, 492.2, 504 R; 355/30
See application file for complete search history.

(56) References Cited

U.S. PATENT DOCUMENTS
4,630,182 A * 12/1986 Moroi et al. ................. 362/294

FOREIGN PATENT DOCUMENTS

| CN | 1875218 A | 12/2006 |
|----|-----------|---------|
| JP | 9-106076 | 4/1997 |
| JP | 11-039934 | 2/1999 |
| JP | 2000-082322 | 3/2000 |
| JP | 2001-005099 | 1/2001 |
| JP | 2003-036720 | 2/2003 |
| JP | 2006-047914 | 2/2006 |

* cited by examiner

*Primary Examiner* — Ismael Negron
(74) *Attorney, Agent, or Firm* — Drinker Biddle & Reath LLP

(57) ABSTRACT

A light source apparatus having a housing including a mercury xenon lamp 3, a reflecting mirror 4, and a gas-blasting structure 5 including a plurality of spray ports for blasting an inert gas onto a reflecting surface of the reflecting mirror. The gas-blasting structure is positioned around an exit aperture of the reflecting mirror, and includes a supply port for receiving the inert gas from the outside. The spray ports are arranged to be off a line along a direction of the gas introduced through the supply port.

8 Claims, 7 Drawing Sheets

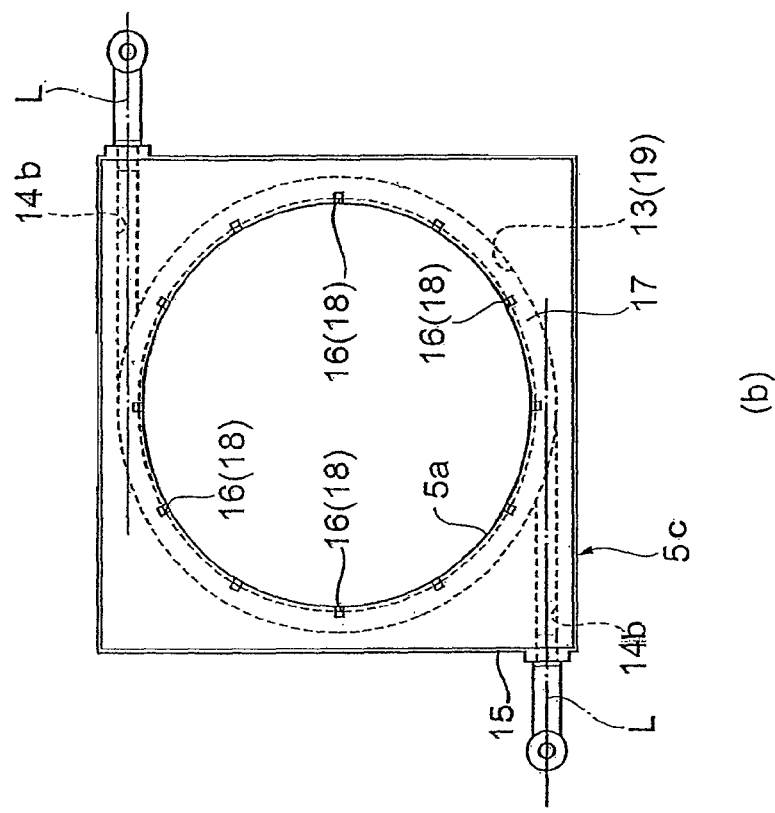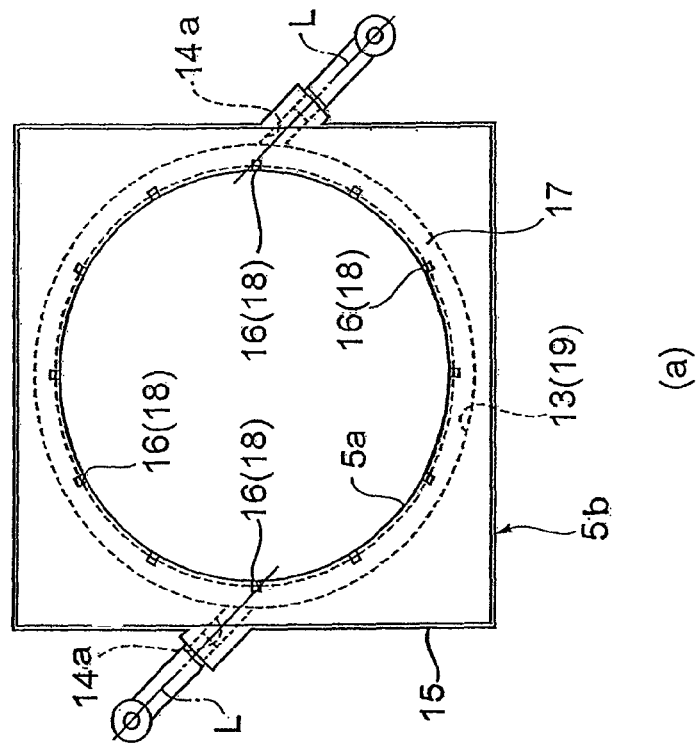
Fig.7

LIGHT SOURCE APPARATUS WITH REFLECTOR GAS-BLASTING STRUCTURE

BACKGROUND OF THE INVENTION

1. Field of the Invention

The present invention relates to a light source apparatus for emitting light.

2. Related Background Art

For example, a photolithography step in fabrication of semiconductor devices is carried out using a light source apparatus adapted to reflect ultraviolet (UV) light emitted from a light source such as a mercury xenon lamp, by a reflecting mirror and to output the reflected UV light, for exposure of a photoresist on a wafer. However, the light source apparatus of this type has the problem that extraneous matter such as sublimates produced during the exposure of the photoresist enters the light source apparatus, together with air introduced for air cooling of the interior of the light source apparatus from the outside, and reacts with the UV light to adhere to the reflecting surface of the reflecting mirror and others.

One of the well-known light source apparatus for solving this problem is the light source apparatus adapted to circulate air via a chemical filter and a cooler to the interior of the light source apparatus (e.g., cf. Japanese Patent Application Laid-open No. 9-106076). This light source apparatus is able to adequately cool the light source while preventing the extraneous matter from adhering to the reflecting surface of the reflecting mirror and others.

SUMMARY OF THE INVENTION

In the above-described conventional light source apparatus, however, the light source is supercooled and, where the light source is the mercury xenon lamp or the like, it could hinder evaporation of mercury, so as to reduce the optical output and shorten the life of the lamp.

Therefore, the present invention has been accomplished in view of the above-described circumstances and an object of the invention is to provide a light source apparatus capable of preventing the supercooling of the light source and the adhesion of extraneous matter to the reflecting surface of the reflecting mirror.

In order to achieve the above object, a light source apparatus according to the present invention is a light source apparatus comprising a light source for emitting light: a reflecting mirror for reflecting the light emitted from the light source, by a reflecting surface thereof, and for outputting the reflected light through an exit aperture; and a gas-blasting structure having a pass aperture through which the light outputted from the reflecting mirror passes, and adapted to blast gas onto the reflecting surface.

In this light source apparatus, the light emitted from the light source is reflected on the reflecting surface of the reflecting mirror and is then outputted to the outside through the exit aperture of the reflecting mirror and the pass aperture of the gas-blasting structure. At this time, the gas is blasted onto the reflecting surface of the reflecting mirror by the gas-blasting structure. This prevents the extraneous matter from adhering to the reflecting surface of the reflecting mirror even if the air for air cooling of the interior of the light source apparatus is introduced from the outside and the extraneous matter, together with the air, enters the light source apparatus. Therefore, this light source apparatus is able to prevent the extraneous matter from adhering to the reflecting surface of the reflecting mirror, without supercooling of the light source.

The light source apparatus according to the present invention preferably comprises a housing adapted to house the light source, the reflecting mirror, and the gas-blasting structure, and to circulate air introduced from the outside. This enables appropriate air cooling of the interior of the light source apparatus while preventing the supercooling of the light source.

In the light source apparatus according to the present invention, preferably, the gas-blasting structure comprises: a supply port for receiving supply of the gas from the outside; a plurality of spray ports arranged so as to surround the pass aperture, and adapted to spray the gas in order to blast the gas onto the reflecting surface; and a distribution path for distributing the gas introduced through the supply port, to the spray ports. When the gas-blasting structure is constructed in this configuration, the gas supplied from the outside can be evenly blasted onto the reflecting surface of the reflecting mirror.

In this case, the spray ports are preferably arranged substantially at even intervals. This enables the gas-blasting structure to blast the gas supplied from the outside, more evenly onto the reflecting surface of the reflecting mirror. Moreover, the distribution path is preferably formed in such a ring shape as to surround the pass aperture. This enables the gas-blasting structure to distribute the gas from the outside readily and smoothly to each spray port.

When the distribution path is formed in the ring shape, the supply port preferably comprises at least a set of supply ports opposed to each other with the pass aperture in between. This equalizes flows of the gas distributed to the respective spray ports. Furthermore, the spray ports are preferably arranged so as to be off a line along a direction of introduction of the gas introduced through the supply port. This equalizes flows of the gas sprayed from the respective spray ports, when compared with a configuration wherein at least one spray port is located on the line along the direction of introduction.

In the light source apparatus according to the present invention, preferably, the gas-blasting structure comprises: a distribution path member in which a groove to become the distribution path is formed; and a spray port member which is attached to the distribution path member so as to cover the groove and in which cuts to become the spray ports are formed. When the gas-blasting structure is constructed in this configuration, the gas-blasting structure can be provided with the distribution path and the spray ports for the gas supplied from the outside, in the simple structure.

In this case, the gas-blasting structure preferably comprises: a positioning member for positioning the reflecting mirror attached to the spray port member. This enables the reflecting mirror to be attached to the gas-blasting structure so that the gas sprayed from each spray port can be evenly blasted onto the reflecting surface.

In the light source apparatus according to the present invention, preferably, the reflecting mirror is a tubular member having the reflecting surface on an internal surface and the exit aperture at one end, and the exit aperture is widened outwardly from the reflecting surface. When the reflecting mirror is constructed in this configuration, the gas can be blasted from the edge of the widened exit aperture onto the reflecting surface of the reflecting mirror. This widens the pass aperture of the gas-blasting structure so that the light emitted from the light source can be efficiently outputted to the outside. Furthermore, preferably, the reflecting mirror is a tubular member having the reflecting surface on an internal surface and the exit aperture at one end; the light source is located in the reflecting mirror in a state in which the light source penetrates an aperture at another end of the reflecting mirror; and a space for passage of the gas blasted onto the reflecting surface by the gas-blasting structure is formed between an edge of the aperture and the light source. This allows the gas sprayed from the gas-blasting structure to be blasted smoothly along the reflecting surface of the reflecting mirror and onto the entire reflecting surface.

In the light source apparatus according to the present invention, the gas blasted onto the reflecting surface by the gas-blasting structure is preferably an inert gas. For example, in a case where the light emitted from the light source is UV light, if the gas blasted onto the reflecting surface is air, the UV light will convert oxygen in air into radicals and it could result in making the reflecting surface cloudy. In contrast to it, when the gas blasted onto the reflecting surface is the inert gas, such cloudiness of the reflecting surface can be prevented.

BRIEF DESCRIPTION OF THE DRAWINGS

FIG. 7 is a plan view of the gas-blasting structure in still another embodiment of the light source apparatus according to the present invention.

DESCRIPTION OF THE PREFERRED EMBODIMENTS

The preferred embodiments of the present invention will be described below in detail with reference to the drawings.

Figure 1:
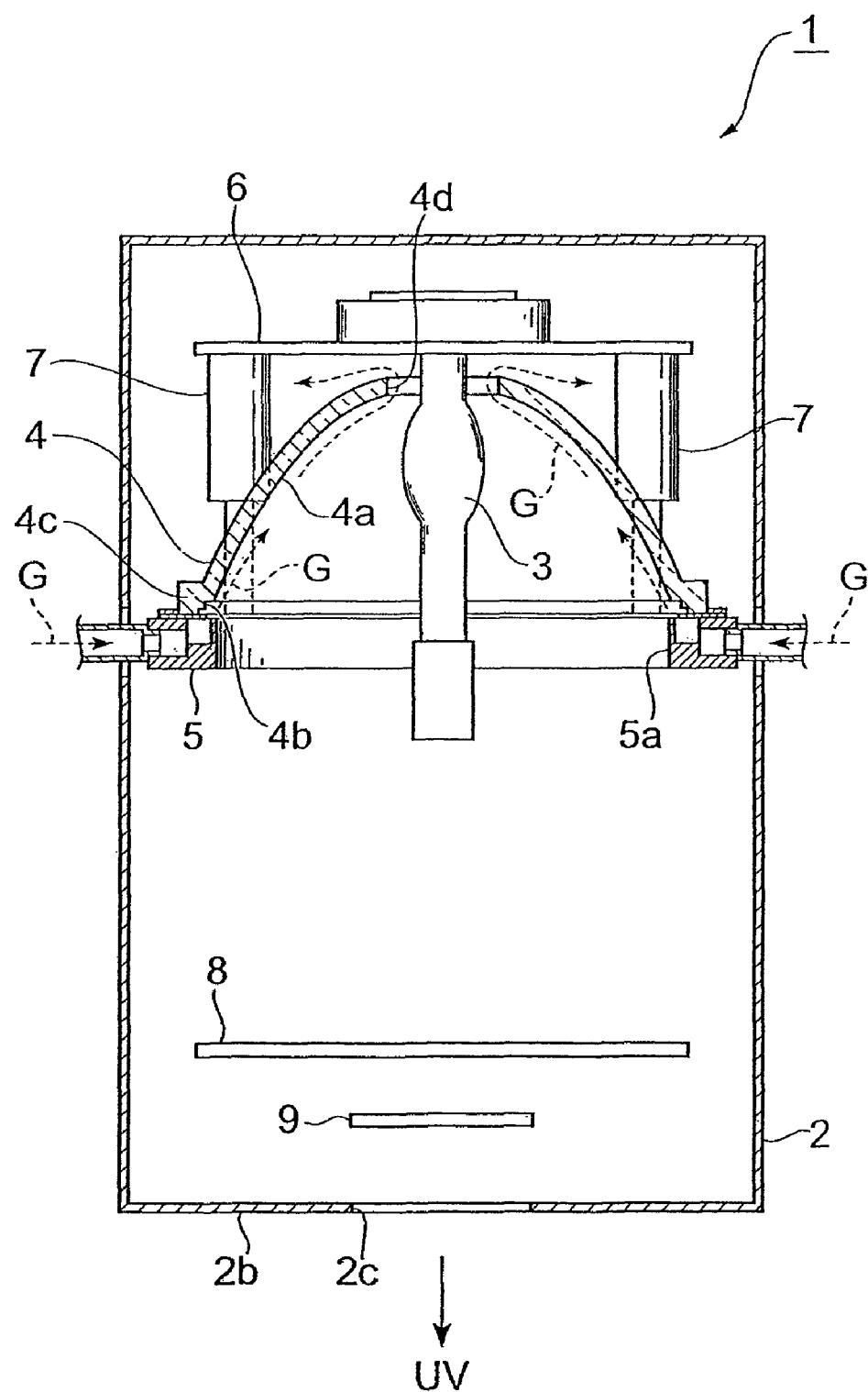
FIG. 1 is a front view showing the interior of an embodiment of the light source apparatus according to the present invention.
Figure 2:
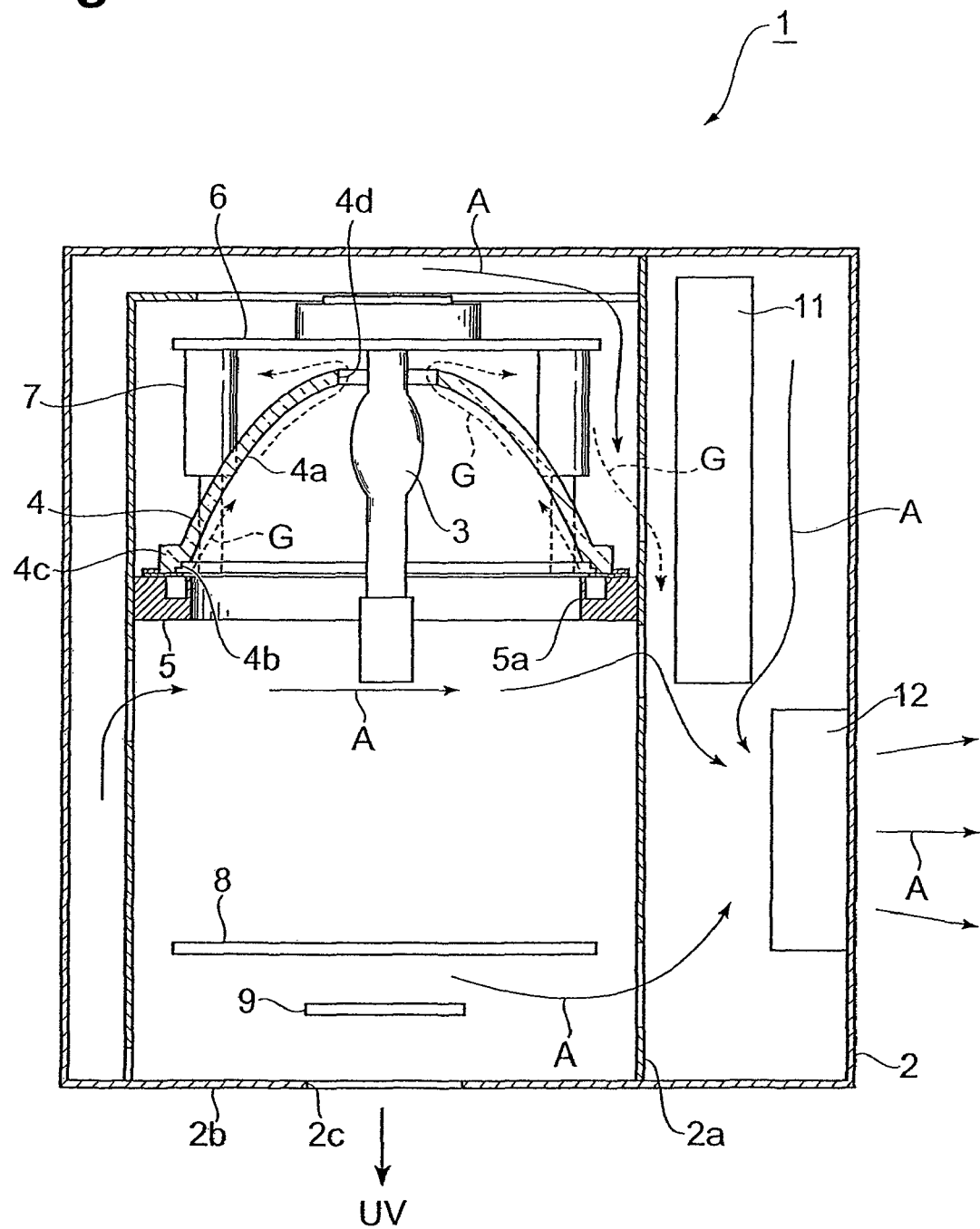
FIG. 2 is a side view showing the interior of the light source apparatus shown in FIG. 1.

As shown in FIGS. 1 and 2, the light source apparatus 1 is of a drop type (vertical type) to output UV light downward, and is used, for example, for exposure of a photoresist on a wafer in the photolithography step in fabrication of semiconductor devices. The light source apparatus 1 has a housing 2 of rectangular parallelepiped shape, and a partition 2a forms a front region and a rear region inside the housing 2.

The following members are housed in the front region of the housing 2: a mercury xenon lamp (light source) 3 for emitting UV light, a reflecting mirror 4 for reflecting the UV light emitted from the mercury xenon lamp 3, by its reflecting surface 4a and for outputting the reflected light downward, and a gas-blasting structure 5 for blasting gas G onto the reflecting surface 4a of the reflecting mirror 4. The gas G blasted onto the reflecting surface 4a is preferably an inert gas (particularly preferably, nitrogen). The reason for it is as follows: if the gas G is air, the UV light will convert oxygen in air into radicals and it could result in making the reflecting surface 4a cloudy; whereas when the gas G is the inert gas, such cloudiness of the reflecting surface 4a can be prevented.

The gas-blasting structure 5 blasts the gas G onto the reflecting surface 4a so as to flow along the reflecting surface 4a of the reflecting mirror 4. The gas-blasting structure 5 is fixed to the housing 2 and supported in the middle of the front region of the housing 2, and has a pass aperture 5a of circular shape through which the UV light outputted downward from the reflecting mirror 4 passes.

The reflecting mirror 4 is a tubular body broadening downward and is mounted on the gas-blasting structure 5. The reflecting surface 4a, e.g. a surface of an ellipsoidal collector mirror, is formed on the internal surface of the reflecting mirror 4. An exit aperture 4b of circular shape, through which the UV light reflected on the reflecting surface 4a passes, and an outwardly directed flange 4c of circular shape are formed at the lower end of the reflecting mirror 4, while an aperture 4d of circular shape is formed at the upper end of the reflecting mirror 4. The reflecting mirror 4 applicable herein is one coated with a metal film of aluminum or the like, one made of a dielectric multilayer film, or the like.

The mercury xenon lamp 3 is attached to a support plate 6 of rectangular shape located above the reflecting mirror 4 and supported in the reflecting mirror 4 in a state in which it penetrates the aperture 4d of the reflecting mirror 4. The support plate 6 is supported by support columns 7 standing at the four corners thereof and on the gas-blasting structure 5. For accurately positioning the mercury xenon lamp 3 relative to the reflecting surface 4a of the reflecting mirror 4, the length of each support column supporting the support plate is finely adjusted by a spacer or the like. Thanks to this configuration, for example, in a case where one mercury xenon lamp 3 reaches the end of its life span, a new mercury xenon lamp 3 can be accurately positioned relative to the reflecting surface 4a of the reflecting mirror 4 by simply attaching it to the support plate 6.

An exit port 2c for outputting the UV light to the outside is formed at the position vertically opposite to the mercury xenon lamp 3 and in a bottom plate 2b of the housing 2. A stop 8 for regulating the amount of the passing UV light is provided between the exit port 2c and the gas-blasting structure 5, and a shutter 9 for switching on and off the output of the UV light through the exit port 2c is provided between the exit port 2c and the stop 8.

A power supply 11 of the light source apparatus 1, and a fan 12 for discharging air A in the housing 2 to the outside thereof are housed in the rear region of the housing 2. An air inlet is formed in each part of the housing 2 and the housing 2 is arranged to circulate air A introduced from the outside (i.e., the exterior of the housing 2), by the fan 12. This allows the interior of the light source apparatus 1 to be appropriately cooled by air, while preventing supercooling of the mercury xenon lamp 3, which can cause reduction in the optical output and decrease in the lifetime of the lamp due to hindrance to evaporation of mercury.

The fan 12 discharges the gas G blasted onto the reflecting surface 4a of the reflecting mirror 4, through the space created between the edge of the aperture 4d of the reflecting mirror 4 and the mercury xenon lamp 3 to the exterior of the housing 2. This allows the gas G sprayed from the gas-blasting structure 5 to be blasted smoothly along the reflecting surface 4a of the reflecting mirror 4 and onto the entire reflecting surface 4a.

The above-described reflecting mirror 4 and gas-blasting structure 5 will be described below in more detail.

Figure 3:
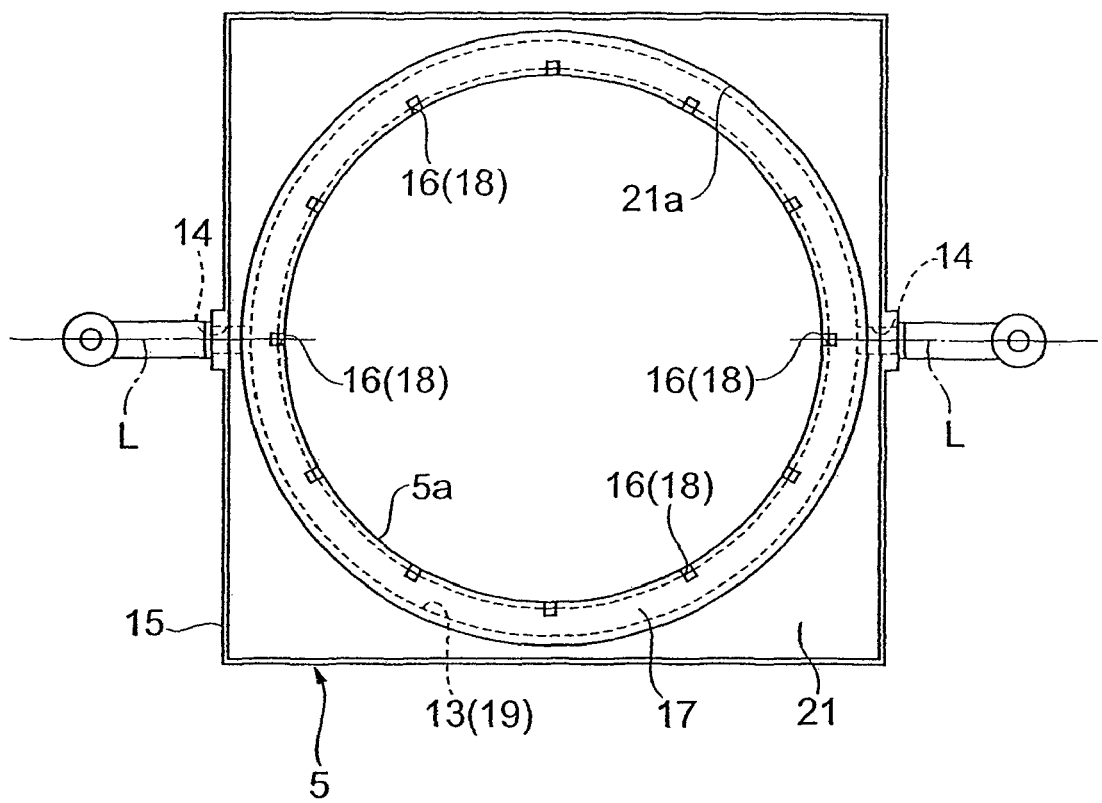
FIG. 3 is a plan view of a gas-blasting structure in the light source apparatus shown in FIG. 1.
Figure 4:
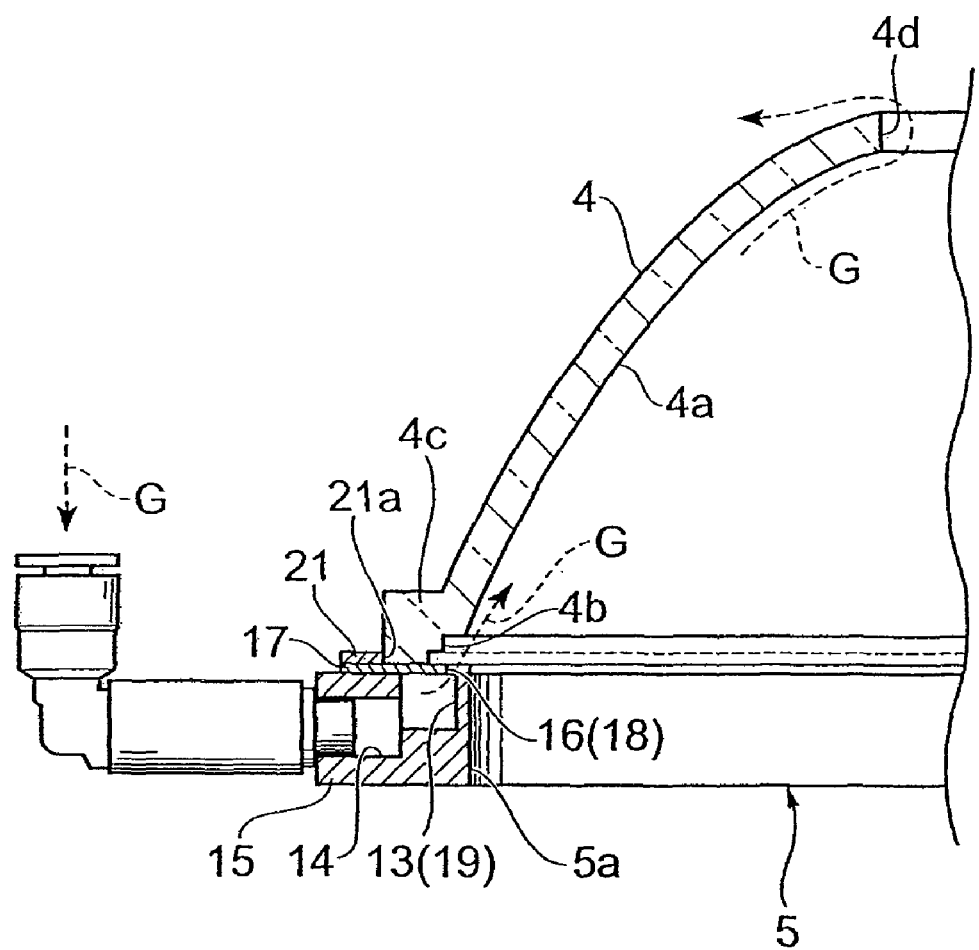
FIG. 4 is an enlarged sectional view of major part of a reflecting mirror and the gas-blasting structure in the light source apparatus shown in FIG. 1.

As shown in FIGS. 3 and 4, the gas-blasting structure 5 has the following members: a distribution path member 15 of rectangular plate shape in which a groove 13 is formed in its upper surface and in such a ring shape as to surround the pass aperture 5a and in which supply ports 14 for receiving the supply of gas G from the outside are formed; a spray port member 17 of rectangular thin plate shape in which twelve cuts 16 of rectangular shape are formed at the 30° pitch in the edge of the pass aperture 5a; and a positioning member 21 of rectangular thin plate shape which positions the reflecting mirror 4 mounted on the spray port member 17. In the distribution path member 15, the supply ports 14 open into the groove 13.

The spray port member 17 is mounted on the distribution path member 15 so as to cover the groove 13. This makes the overlap portions between the groove 13 and cuts 16 serve as spray ports 18 of a rectangular cross section (e.g., 2.5 mm×0.5 mm) for spraying the gas G in order to blast the gas G on the reflecting surface 4a of the reflecting mirror 4. Furthermore, the groove 13 serves as a distribution path 19 of a rectangular cross section (e.g., 5 mm×5 mm) for distributing the gas G introduced at a predetermined flow rate (e.g., 2-10 liters/minute) through the supply ports 14 of a circular cross section (e.g., in the diameter of 5 mm), to the spray ports 18. When the gas-blasting structure 5 is constructed in this configuration, the gas-blasting structure 5 can be provided with the distribution path 19 and spray ports 18 for the gas G supplied from the outside, in the simple structure.

The twelve spray ports 18 are arranged at the 30° pitch so as to surround the pass aperture 5a in the above configuration, but it is noted that the gas G supplied from the outside can be extremely evenly blasted onto the reflecting surface 4a of the reflecting mirror 4 as long as a plurality of spray ports (preferably, 6-24 spray ports) are arranged at nearly even intervals. Since the distribution path 19 is formed in such a ring shape as to surround the pass aperture 5a, the gas G supplied from the outside can be readily and smoothly distributed to each spray port 18. Furthermore, since a set of supply ports 14 (which may be two or more sets) are provided so as to be opposed to each other with the pass aperture 5a in between, flows of the gas G distributed to the respective spray ports can be equalized.

The positioning member 21 is provided with an aperture 21a in which the outwardly directed flange 4c of the reflecting mirror 4 is fitted. Thanks to this configuration, by simply fitting the outwardly directed flange 4c into the aperture 21a, the reflecting mirror 4 can be attached to the gas-blasting structure 5 so that the gas G sprayed through each spray port 18 can be evenly blasted onto the reflecting surface 4a of the reflecting mirror 4.

In the reflecting mirror 4, the exit aperture 4b is so stepped as to be widened outwardly from the reflecting surface 4a. This allows each spray port to be arranged in the gas-blasting structure 5 and along the edge of the widened exit aperture 4b and thereby enables the gas G to be blasted from the edge of the widened exit aperture 4b onto the reflecting surface 4a. For this reason, the pass aperture 5a of the gas-blasting structure 5 is widened so that the UV light emitted from the mercury xenon lamp 3 can be efficiently outputted to the outside. Alternatively, the exit aperture 4b may be tapered so as to be widened outwardly from the reflecting surface 4a.

In the light source apparatus 1 constructed as described above, the UV light emitted from the mercury xenon lamp 3 is reflected on the reflecting surface 4a of the reflecting mirror 4 and outputted to the outside through the exit aperture 4b of the reflecting mirror 4, the pass aperture 5a of the gas-blasting structure 5, the stop 8, and the exit port 2c of the housing 2. At this time, the gas-blasting structure 5 blasts the gas G onto the reflecting surface 4a of the reflecting mirror 4. Thanks to this configuration, even if extraneous matter (e.g., sublimates produced during exposure of a photoresist, or the like) enters the light source apparatus 1 along with the air A introduced for air cooling of the interior of the light source apparatus 1, the extraneous matter is prevented from adhering to the reflecting surface 4a of the reflecting mirror 4. Therefore, the light source apparatus 1 is able to prevent the extraneous matter from adhering to the reflecting surface 4a of the reflecting mirror 4, without supercooling of the mercury xenon lamp 3.

It is noted that the present invention is by no means limited to the above-described embodiment.

Figure 5:
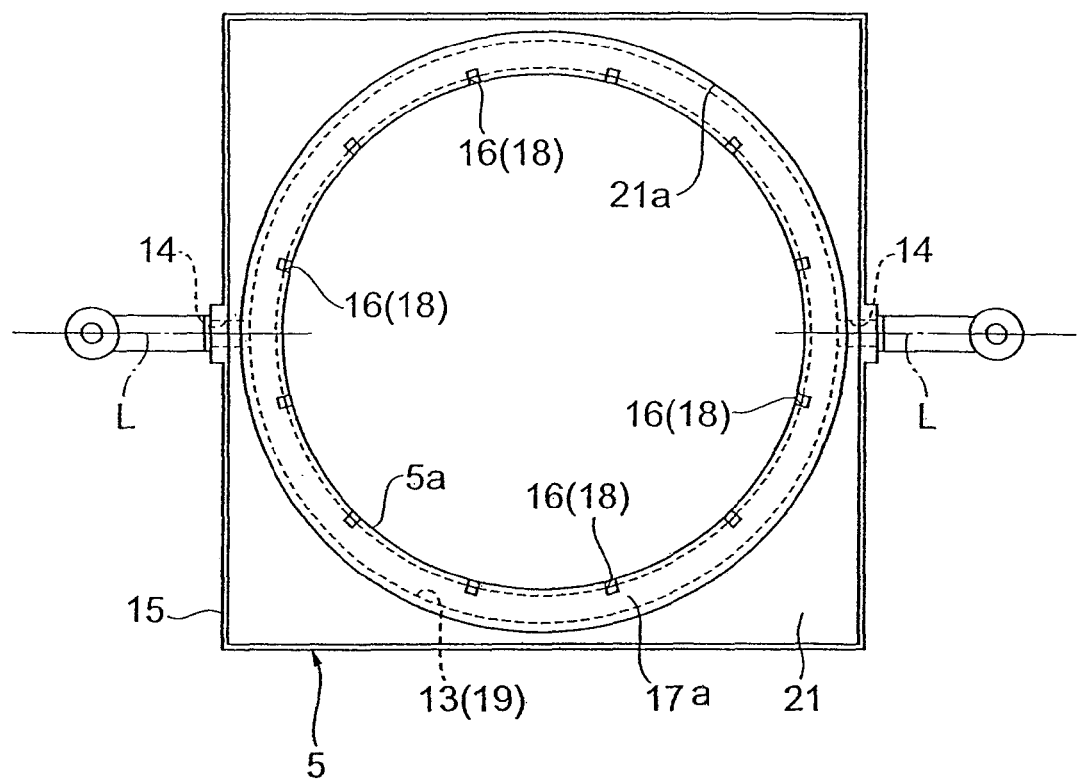
FIG. 5 is a plan view of the gas-blasting structure in another embodiment of the light source apparatus according to the present invention.

For example, as shown in FIG. 5, the spray ports 18 are preferably arranged so as to be off a line L along a direction of introduction of the gas G introduced through the supply ports. The reason for it is that the flows of gas G sprayed from the respective spray ports are more equalized, when compared with a configuration wherein at least one spray port is arranged on the introduction-direction line L.

Figure 6:
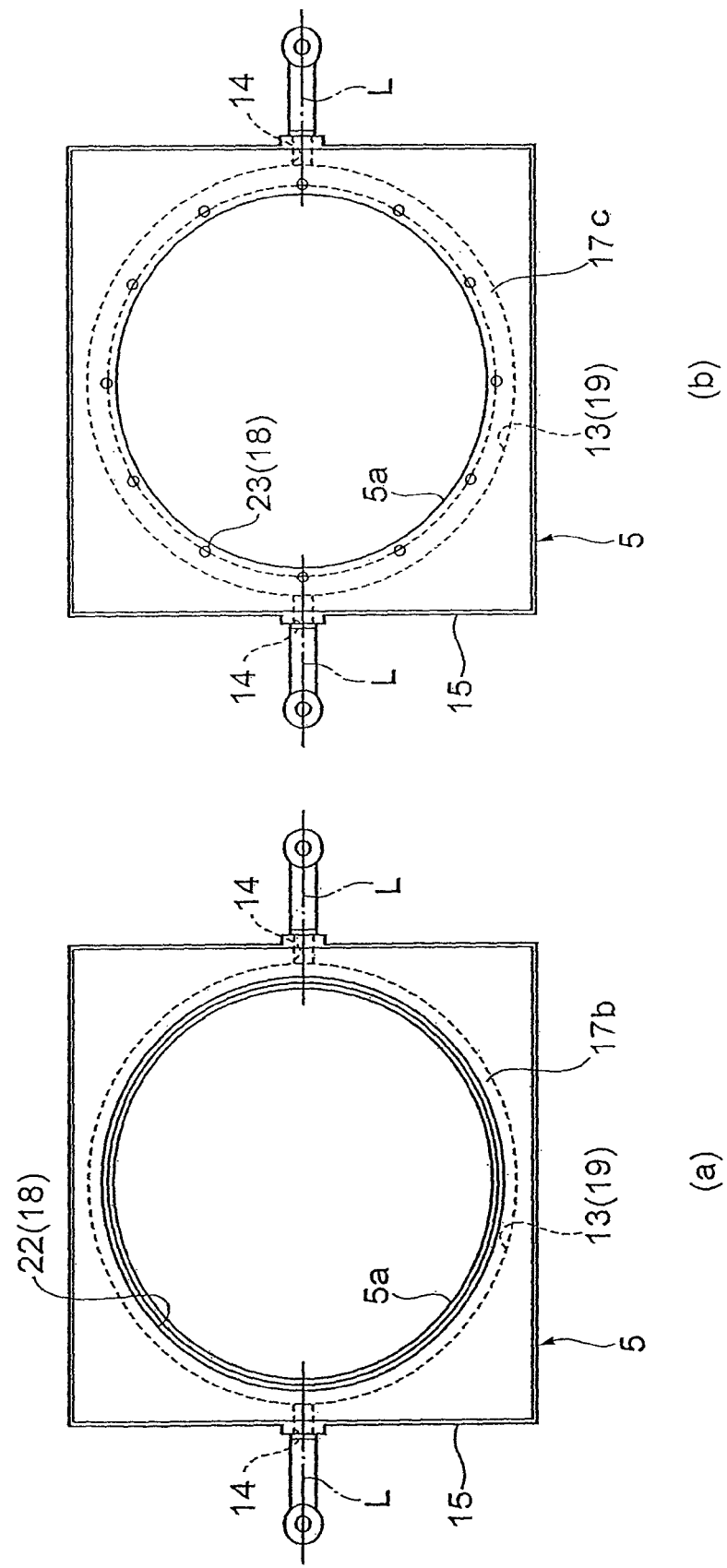
FIG. 6 is a plan view of the gas-blasting structure in still another embodiment of the light source apparatus according to the present invention.

Instead of the cuts 16 in spray port member 17a of FIG. 5, a slit 22 may be formed along the groove 13 of the distribution path member 15 and in the spray port member 17b, as shown in FIG. 6 (a); or, a plurality of through holes 23 may be formed along the groove 13 of the distribution path member 15 and in the spray port member 17c, as shown in FIG. 6 (b).

In another potential configuration, as shown in FIG. 7 (a), among at least one set of supply ports 14a opposed with the pass aperture 5a in between, the introduction-direction line L of one supply port 14a is directed toward one side of the distribution path 19 of the ring shape, while the introduction-direction line L of the other supply port 14 is directed toward the other side of the distribution path 19 of the ring shape within the gas-blasting structure 5b. In still another potential configuration, as shown in FIG. 7 (b), the introduction-direction lines L of at least one set of supply ports 14b opposed with the pass aperture 5a in between are set along respective tangent lines to the distribution path of the ring shape within the gas-blasting structure 5c. These configurations achieve further equalization of the flows of the gas G distributed to the respective spray ports.

The light source does not always have to be limited to the mercury xenon lamp 3, but it may be selected from a wide variety of lamps such as a high pressure mercury lamp, an ultrahigh pressure mercury lamp, and a metal halide lamp.

Furthermore, the light source apparatus 1 was that of the drop type (vertical type), but it may be of any other type, e.g., a horizontal type, which also achieves the effect of preventing the supercooling of the light source, and the adhesion of extraneous matter to the reflecting surface of the reflecting mirror.

The present invention prevents the supercooling of the light source, and the adhesion of extraneous matter to the reflecting surface of the reflecting mirror.

What is claimed is:

1. A light source apparatus comprising:
a light source for emitting ultraviolet light:
a reflecting mirror for reflecting the ultraviolet light emitted from the light source, by a reflecting surface thereof, and for outputting the reflected ultraviolet light through an exit aperture;
a gas-blasting structure having a pass aperture through which the ultraviolet light outputted from the reflecting mirror passes, and configured to blast gas onto the reflecting surface, and
comprising a housing adapted to house the light source, the reflecting mirror, and the gas-blasting structure, and to circulate air introduced from the outside,
wherein the gas-blasting structure comprises:
a supply port for receiving supply of the gas from the outside;
a plurality of spray ports arranged so as to surround the pass aperture, and configured to spray the gas in order to blast the gas onto the reflecting surface; and
a distribution path for distributing the gas introduced through the supply port, to the spray ports, wherein the distribution path is formed in such a ring shape as to surround the pass aperture, wherein the spray ports are arranged so as to be off a line along a direction of introduction of the gas introduced through the supply port, wherein the gas blasted onto the reflecting surface by the gas-blasting structure is an inert gas, the apparatus being configured so that only an inert gas is blasted onto the reflecting surface by the gas-blasting structure, said inert gas being different in composition from said air introduced from the outside, said air containing oxygen and being provided into the housing to cool the apparatus, and said inert gas being provided to prevent said air from being supplied to said reflecting surface of said reflecting mirror to prevent said reflecting surface from becoming cloudy from oxygen radicalized by said ultraviolet light, and wherein air passages are provided in the housing between an exit port for outputting the ultraviolet light to the outside and the gas-blasting structure.

2. The light source apparatus according to claim 1, wherein the spray ports are arranged substantially at even intervals.

3. The light source apparatus according to claim 1, wherein said supply port comprises at least a set of supply ports opposed to each other with the pass aperture in between.

4. The light source apparatus according to claim 1, wherein the reflecting mirror is a tubular member having the reflecting surface on an internal surface and the exit aperture at one end, and wherein the exit aperture is widened outwardly from the reflecting surface.

5. The light source apparatus according to claim 1, wherein the reflecting mirror is a tubular member having the reflecting surface on an internal surface and the exit aperture at one end, wherein the light source is located in the reflecting mirror in a state in which the light source penetrates an aperture at another end of the reflecting mirror, and wherein a space for passage of the gas blasted onto the reflecting surface by the gas-blasting structure is formed between an edge of the aperture and the light source.

6. The light source apparatus according to claim 1, wherein the spray ports are arranged along the edge of the exit aperture and are directed toward the edge of the exit aperture.

7. The light source apparatus according to claim 1, wherein the gas-blasting structure comprises:

a distribution path member in which a groove to become the distribution path is formed; and a spray port member which is attached to the distribution path member so as to cover the groove and in which cuts to become the spray ports are formed.

8. The light source apparatus according to claim 7, wherein the gas-blasting structure comprises:

a positioning member for positioning the reflecting mirror attached to the spray port member.

* * * * *